(12) United States Patent
Loccufier et al.

US008889340B2

(10) Patent No.: US 8,889,340 B2
(45) Date of Patent: Nov. 18, 2014

(54) METHOD FOR MAKING A LITHOGRAPHIC PRINTING PLATE

(75) Inventors: Johan Loccufier, Zwijnaarde (BE);
Stefaan Lingier, Agfa Graphics NV (BE); Mark Lens, Mortsel (BE)

(73) Assignee: Agfa Graphics, N.V., Mortsel (BE)

( * ) Notice: Subject to any disclaimer, the term of this patent is extended or adjusted under 35 U.S.C. 154(b) by 619 days.

(21) Appl. No.: 12/670,836

(22) PCT Filed: Aug. 13, 2008

(86) PCT No.: PCT/EP2008/060628
§ 371 (c)(1),
(2), (4) Date: Jan. 26, 2010

(87) PCT Pub. No.: WO2009/021969
PCT Pub. Date: Feb. 19, 2009

(65) Prior Publication Data
US 2010/0227271 A1    Sep. 9, 2010

Related U.S. Application Data

(60) Provisional application No. 60/955,925, filed on Aug. 15, 2007.

(30) Foreign Application Priority Data

Aug. 14, 2007   (EP) .................................... 07114332

(51) Int. Cl.
*B41M 5/00*    (2006.01)
*B41N 1/00*    (2006.01)
*G03F 7/00*    (2006.01)
*G03F 7/26*    (2006.01)
*B41C 1/10*    (2006.01)
*G03F 7/32*    (2006.01)

(52) U.S. Cl.
CPC ........... *B41C 1/1008* (2013.01); *B41C 2210/06* (2013.01); *B41C 2210/04* (2013.01); *B41C 2210/02* (2013.01); *G03F 7/322* (2013.01); *B41C 2210/262* (2013.01); *B41C 2210/22* (2013.01); *B41C 2210/24* (2013.01)
USPC .................... 430/302; 430/270.1; 430/271.1; 430/300; 101/450.1; 101/453

(58) Field of Classification Search
CPC .. G03F 7/322; B41C 2210/02; B41C 2210/06
USPC ............... 430/302, 331, 434, 435, 270.1, 401
See application file for complete search history.

(56) References Cited

U.S. PATENT DOCUMENTS

| 3,929,488 | A |   | 12/1975 | Smith |   |
|---|---|---|---|---|---|
| 4,727,017 | A | * | 2/1988 | Pollet et al. | .................... 430/611 |
| 4,859,565 | A |   | 8/1989 | De Keyzer et al. |   |
| 5,968,725 | A |   | 10/1999 | Katoh et al. |   |
| 6,143,464 | A |   | 11/2000 | Kawauchi |   |
| 6,162,575 | A |   | 12/2000 | Fujioka et al. |   |
| 6,190,825 | B1 |   | 2/2001 | Denzinger et al. |   |
| 2002/0132193 | A1 |   | 9/2002 | Iwata et al. |   |
| 2003/0013044 | A1 |   | 1/2003 | Coppens et al. |   |
| 2005/0175942 | A1 | * | 8/2005 | Ohnishi | ......................... 430/434 |
| 2007/0298351 | A1 | * | 12/2007 | Shimada et al. | ........... 430/281.1 |
| 2009/0017398 | A1 | * | 1/2009 | Loccufier et al. | ........... 430/281.1 |

FOREIGN PATENT DOCUMENTS

| EP | 0 208 346 | A2 |   | 1/1987 |
|---|---|---|---|---|
| EP | 0 517 245 | A1 |   | 6/1992 |
| EP | 0 864 420 | A1 |   | 9/1998 |
| EP | 0 909 657 | A2 |   | 4/1999 |
| EP | 0 933 682 | A2 |   | 8/1999 |
| EP | 0 934 822 | A1 |   | 8/1999 |
| EP | 1 033 399 | A2 |   | 9/2000 |
| EP | 1 072 432 | A2 |   | 1/2001 |
| EP | 1 120 246 | A2 |   | 8/2001 |
| EP | 1 211 065 | A2 |   | 6/2002 |
| EP | 1 241 003 | A2 |   | 9/2002 |
| EP | 1 262 318 | A2 |   | 12/2002 |
| EP | 1 275 498 | A2 |   | 1/2003 |
| EP | 1 291 172 | A2 |   | 3/2003 |
| EP | 1 433 594 | A2 |   | 6/2004 |
| EP | 1 268 660 | B1 |   | 7/2004 |
| EP | 1 439 058 | A2 |   | 7/2004 |
| EP | 1 311 394 | B1 |   | 12/2004 |
| EP | 1 263 590 | B1 |   | 3/2005 |
| EP | 1 011 970 | B1 |   | 2/2006 |
| EP | 1 299 238 | B1 |   | 2/2007 |
| EP | 1 368 413 | B1 |   | 7/2008 |
| GB | 1 401 112 | A |   | 7/1975 |
| JP | 55-134848 | A |   | 10/1980 |
| JP | 05188537 | A | * | 7/1993 |
| JP | 2001-201858 | A |   | 7/2001 |
| WO | WO 97/39894 | A1 |   | 10/1997 |
| WO | WO 99/01795 | A2 |   | 1/1999 |
| WO | WO 99/63407 | A1 |   | 12/1999 |
| WO | WO 01/09682 | A2 |   | 2/2001 |
| WO | WO 02/053626 | A1 |   | 7/2002 |
| WO | WO 2004/020484 | A1 |   | 3/2004 |
| WO | WO 2004/033206 | A1 |   | 4/2004 |
| WO | WO 2004/035310 | A1 |   | 4/2004 |
| WO | WO 2004/035645 | A1 |   | 4/2004 |
| WO | WO 2004/035686 | A2 |   | 4/2004 |

(Continued)

OTHER PUBLICATIONS

EP Search Report for EP 07 11 4332 (Jan. 16, 2008).

(Continued)

*Primary Examiner* — Chanceity Robinson
(74) *Attorney, Agent, or Firm* — Leydig, Voit & Mayer, Ltd.

(57) ABSTRACT

A method for making a lithographic printing plate is disclosed which comprises the steps of: (1) providing a heat-sensitive lithographic printing plate precursor comprising on a support having a hydrophilic surface or which is provided with a hydrophilic layer, a heat-sensitive coating, (2) image-wise exposing said precursor with IR-radiation or heat, and (3) developing said image-wise exposed precursor with an alkaline developing solution, characterised in that a sludge inhibiting agent is present in said precursor or in said developing solution or in said precursor and said developing solution, and wherein said sludge inhibiting agent is a triazaindolisine compound. According to the above method, the formation of sludge is inhibited or reduced.

10 Claims, No Drawings

(56) References Cited

FOREIGN PATENT DOCUMENTS

| WO | WO 2004/035687 A1 | 4/2004 |
| WO | WO 2005/001571 A2 | 1/2005 |

OTHER PUBLICATIONS

International Search Report for PCT/EP2008/060628 (Nov. 20, 2008).

* cited by examiner

METHOD FOR MAKING A LITHOGRAPHIC PRINTING PLATE

FIELD OF THE INVENTION

The present invention relates to a method for making a lithographic printing plate wherein an image-wise exposed precursor is developed with an alkaline developing solution wherein a sludge inhibiting agent is present in said precursor or in said developing solution or in both said precursor and said developing solution, and wherein said sludge inhibiting agent is a triazaindolisine compound.

The present invention relates also to an alkaline developing or replenishing solution comprising said sludge inhibiting agent.

The present invention relates also to a lithographic printing plate precursor comprising said sludge inhibiting agent.

BACKGROUND OF THE INVENTION

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. A typical positive-working plate precursor comprises a hydrophilic support and an oleophilic coating which is not readily soluble in an aqueous alkaline developer in the non-exposed state and becomes soluble in the developer after exposure to radiation. In addition to the well known photo-sensitive imaging materials which are suitable for UV contact exposure through a film mask (the so-called pre-sensitized plates), also heat-sensitive printing plate precursors have become very popular. Such thermal materials offer the advantage of daylight stability and are especially used in the so-called computer-to-plate method (CtP) wherein the plate precursor is directly exposed, i.e. without the use of a film mask. The material is exposed to heat or to infrared light and the generated heat triggers a (physico-)chemical process, such as ablation, polymerization, insolubilization by cross-linking of a polymer or by particle coagulation of a thermoplastic polymer latex, and solubilization by the destruction of intermolecular interactions or by increasing the penetrability of a development barrier layer.

Although some of these thermal processes enable plate-making without wet processing, the most popular thermal plates form an image by a heat-induced solubility difference in an alkaline developer between exposed and non-exposed areas of the coating. The coating typically comprises an oleophilic binder of which the rate of dissolution in the developer is either reduced (negative working) or increased (positive working) by the image-wise exposure.

Typically, the oleophilic resin in a heat-sensitive plate is a phenolic resin such as novolac, resol or a polyvinylphenolic resin. The phenolic resin can be chemically modified whereby the phenolic monomeric unit is substituted by a group such as described in WO99/01795, EP 934 822, EP 1 072 432, U.S. Pat. No. 3,929,488, WO 2004/035687, WO 2004/035686, WO 2004/035645, WO 2004/035310. The phenolic resin can also been mixed with other polymers as described in WO2004/020484, U.S. Pat. No. 6,143,464, WO2001/09682, EP 933 682, WO99/63407, WO2002/53626, EP 1 433 594 and EP 1 439 058. The coating can also be composed of two or more layers, each of them comprising one or more of the above described resins as described in e.g. EP 864420, EP 909657, EP-A 1011970, EP-A 1263590, EP-A 1268660, EP-A 1072432, EP-A 1120246, EP-A 1303399, EP-A 1311394, EP-A 1211065, EP-A 1368413, EP-A 1241003, EP-A 1299238, EP-A 1262318, EP-A 1275498, EP-A 1291172, WO2003/74287, WO2004/33206, EP-A 1433594 and EP-A 1439058.

For a positive-working thermal plate, a dissolution inhibitor is added to a phenolic resin as binder whereby the rate of dissolution of the coating is reduced. Upon heating, this reduced rate of dissolution of the coating is increased on the exposed areas compared with the non-exposed areas, resulting in a sufficient difference in solubility of the coating after image-wise recording by heat or IR-radiation. Many different dissolution inhibitors are known and disclosed in the literature, such as organic compounds having an aromatic group and a hydrogen bonding site or polymers or surfactants comprising siloxane or fluoroalkyl units.

During processing, the solubility differential leads to the removal of non-image (non-printing) areas of the coating, thereby revealing the hydrophilic support, while image (printing) areas of the coating remain on the support. Thereby, the coating of the non-image (non-printing) areas is solubilized in the alkaline developing solution and the ingredients constituting the coating accumulate in the developing solution and may result in the formation of sludge. Under sludge is understood all kinds of insoluble matter such as undissolved, flocculated or precipitated products or gel structures, formed in the developing solution by interaction between the ingredients of the coating and the developing solution. This insoluble matter may adhere on the plate surface impairing the image on the plate and may also contaminate the developing station by adhesion on the surface of the rollers and the developing tanks. As a result of the formation of sludge, the development process may be hindered (increased viscosity of the developing solution, impairing of the image on the plate and contamination of the developing station, clogging of filters) and the developing solution needs to be changed regularly.

WO 97/39894 discloses an oleophilic heat-sensitive composition comprising a polymer, soluble in an aqueous developer, and an inhibiting compound such as a nitrogen-containing heterocyclic compound (e.g. quinoline and 1,2,4-triazole), which reduces the aqueous solubility of the polymer, and wherein the solubility of the composition in the developer is increased upon heating.

EP 1 439 058 discloses a planographic printing plate precursor including a hydrophilic support and, thereon, a lower layer, comprising a thiazole compound, and an image forming layer. The developing solution may comprise benzimidazole.

WO 2004/020484 discloses a heat-sensitive positive working lithographic printing plate precursor comprising an optionally pre-treated substrate and a positive working heat-sensitive coating. The coating may comprise a triazole compound or a benzthiazole compound.

US 2002/0132193 discloses a developing solution for a photoresist comprising an alicyclic amine compound such as pyrrole, pyrrolidine, pyrrolidone, pyridine, morpholine, pyrazine, piperidine, oxazole or thiazole, and a non-metallic alkali compound.

WO 2005/001571 discloses an infrared sensitive composition comprising a chain transfer agents such as 2-mercaptobenzimidazole, 2-mercaptobenzthiazole, 2-mercaptobenzoxazole or 3-mercapto-1,2,4-triazole.

U.S. Pat. No. 6,162,575 discloses a process for making a lithographic printing plate, which comprises subjecting a lithographic printing material having physical development nuclei between an anodized aluminum support and a silver halide emulsion layer to exposure and then processing the material with a developing solution containing an alkaline earth metal. The developing solution may further comprise a nitrogen-containing heterocyclic ring compound having a mercapto group and a thione group such as derivates of imidazole, benzimiodazole, thiazole, benzthiazole, oxazole, benzoxazole, triazole, thiadiazole, oxathiazole, oxadiazole, tetrazole, pyridine, quinoline, pyridazine, pyrazine, trazine or triazoline.

EP 517 245 discloses a developer for light-sensitive material capable of processing a light-sensitive lithographic printing plate material. The developer comprises an alkali agent, an anionic surface active agent and an antifoggant for a silver halide photographic material such as derivates of benzimidazole, benztriazole or tetrazole.

SUMMARY OF THE INVENTION

It is an aspect of the present invention to provide a method for making a heat-sensitive lithographic printing plate whereby excellent printing properties are obtained and whereby the occurrence of sludge is inhibited or reduced. This object is realized by the method described herein, having the characteristic feature that the precursor or the developing solution or both the precursor and the developing solution comprise a sludge inhibiting agent which is a triazaindolisine compound.

It is also an aspect of the present invention to provide an alkaline developing or replenishing solution comprising a sludge inhibiting agent which is a triazaindolisine compound.

It is also an aspect of the present invention to provide a lithographic printing plate precursor comprising a sludge inhibiting agent which is a triazaindolisine compound.

Specific embodiments of the invention are defined in the dependent claims.

DETAILED DESCRIPTION OF THE INVENTION

In accordance with the present invention, there is provided a method for making a lithographic printing plate comprising the steps of:
(1) providing a heat-sensitive lithographic printing plate precursor comprising on a support having a hydrophilic surface or which is provided with a hydrophilic layer, a heat-sensitive coating,
(2) image-wise exposing said precursor with IR-radiation or heat, and
(3) developing said image-wise exposed precursor with an alkaline developing solution,
characterised in that a sludge inhibiting agent is present in said precursor or in said developing solution or in said precursor and said developing solution, and wherein said sludge inhibiting agent is a triazaindolisine compound, having a structure according to formula I,

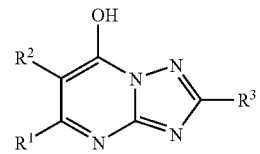
(Formula I)

wherein
$R^1$ is hydrogen, an optionally substituted alkyl, alkenyl, alkynyl, aralkyl, alkaryl, aryl or heteroaryl group, —$OR^4$, —$COOR^5$, —CO—$NR^6R^7$, —$NR^8$—CO—$R^{12}$ or —$NR^{10}R^{11}$;
$R^2$ is hydrogen, an optionally substituted alkyl, alkenyl, alkynyl, aralkyl, alkaryl, aryl or heteroaryl group, a halogen, —$COOR^5$, —CO—$NR^6R^7$, —$NR^8$—CO—$R^{12}$ or —$NR^{10}R^{11}$;
$R^3$ is hydrogen, an optionally substituted alkyl, alkenyl, alkynyl, aralkyl, alkaryl, aryl or heteroaryl group, —$SR^9$, —$COOR^5$, —CO—$NR^6R^7$, —$NR^8$—CO—$R^{12}$ or —$NR^{10}R^{11}$;
$R^4$ to $R^{11}$ independently are selected from hydrogen, an optionally substituted alkyl, alkenyl, alkynyl, aralkyl, alkaryl, aryl or heteroaryl group;
$R^{12}$ is selected from hydrogen, an optionally substituted alkyl, alkenyl, alkynyl, aralkyl, alkaryl, aryl or heteroaryl group, —$OR^{13}$ or —$NR^{10}R^{11}$;
$R^{13}$ is selected from an optionally substituted alkyl, alkenyl, alkynyl, aralkyl, alkaryl, aryl or heteroaryl group; or
each of $R^1$ and $R^2$, $R^6$ and $R^7$, $R^8$ and $R^{12}$, or $R^{10}$ and $R^{11}$ represent the necessary atoms to form a 5 to 7 membered ring.

In a preferred embodiment, $R^1$ and $R^2$ independently are selected from hydrogen or an optionally substituted alkyl group.

In another preferred embodiment, $R^3$ is selected from hydrogen, an optionally substituted alkyl group having 1 to 5 carbon atoms, or —$SR^{12}$, more preferably $R^3$ is hydrogen.

Said optionally substituting group of said alkyl, alkenyl, alkynyl, aralkyl, aryl or heteroaryl group as defined in each of said groups of $R^1$ to $R^{13}$ is preferably a hydrophilic group. Said hydrophilic group is preferably selected from a carboxylic acid or salt thereof, a sulphonic acid or salt thereof, a sulphuric acid or salt thereof, a phosphonic acid or salt thereof, a phosphoric acid or salt thereof, and an aromatic alcohol or salt thereof, a hydroxyl group, a thiol group, a sulphonamide group, a non-ionic hydrophilic group such as an ethylene oxide group or a polymeric chain of two or more ethylene oxide groups (e.g. 3 to 50 ethylene oxide groups), or a combination of two or more of these hydrophilic groups. By incorporating such a hydrophilic group on at least one of the groups of $R^1$ to $R^{13}$, the solubility of the triazaindolisine compound of the present invention in the developing solution may be improved.

In another preferred embodiment of the present invention, the solubility of the triazaindolisine compounds of the present invention in the developing solution may be improved by adding to the developing solution a solubilizing compound such as an organic solvent, preferably a water-miscible organic solvent, a surfactant, preferably an anionic or non-ionic surfactant, a complexing agent, a chelating agent or a combination of such compounds.

In another preferred embodiment of the present invention, the triazaindolisine compound of the present invention is soluble in the developing solution at the temperature of the developing processing. This temperature is preferably between 18° C. and 30° C., more preferably between 20° C. and 25° C., most preferably 20° C.

In a more preferred embodiment of the present invention, the triazaindolisine compound of the present invention is soluble in the developing solution at 20° C. for at least 1 g/l, more preferably at least 2 g/l, most preferably at least 3 g/l.

In another preferred embodiment of the present invention, the triazaindolisine compound of the present invention is soluble in an alkaline solution of water of pH 12 at 20° C. for at least 1 g/l, more preferably at least 2 g/l, most preferably at least 3 g/l.

Examples of triazaindolisine compounds of the present invention are:

Triazaindolisine-01:

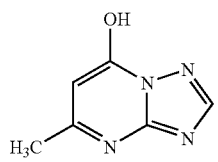

Triazaindolisine-02:

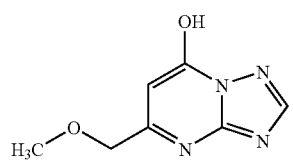

Triazaindolisine-03:

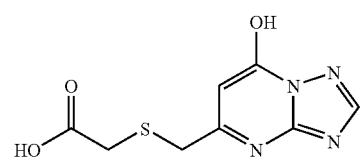

Triazaindolisine-04:

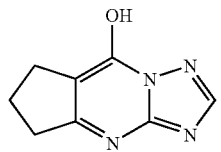

Triazaindolisine-05:

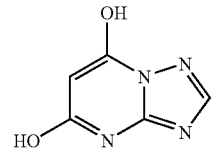

Triazaindolisine-06:

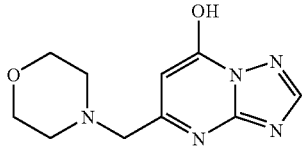

Triazaindolisine-07:

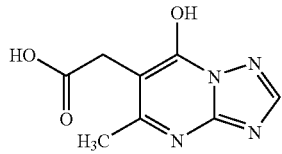

Triazaindolisine-08:

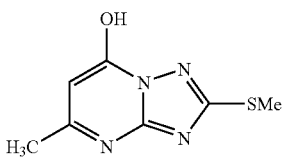

Triazaindolisine-09:

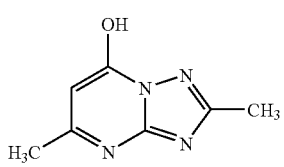

Triazaindolisine-10:

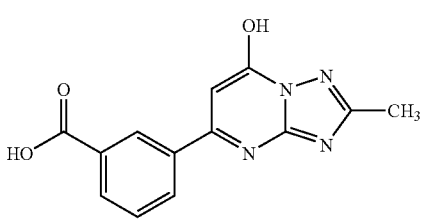

Triazaindolisine-11:

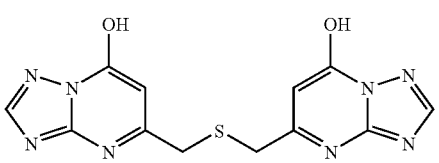

Triazaindolisine-12:

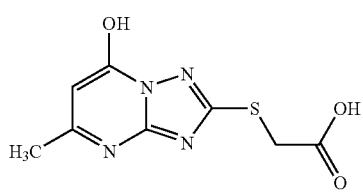

Triazaindolisine-13:

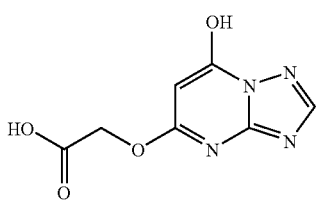

Triazaindolisine-14:

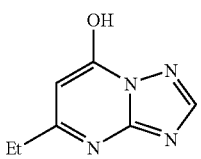

Triazaindolisine-15:

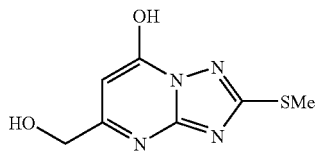

Triazaindolisine-16:

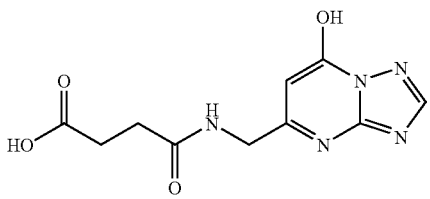

Triazaindolisine-17:

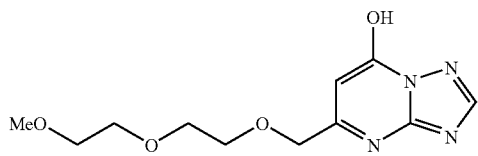

Triazaindolisine-18:

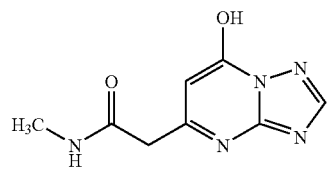

Triazaindolisine-19:

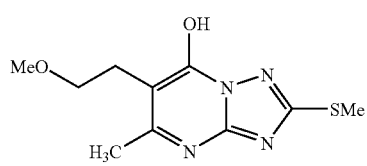

In accordance with the present invention, at least two of said triazaindolisine compounds may be present, optionally linked together by a linking group. Said linking group may be a group which is substituted on at least one of the groups $R^1$ to $R^{13}$ of each the linked trazaindolisine compounds. The linking group is selected from the group consisting of an linear, branched or cyclic alkylene group such as a methylene, ethylene, propylene, butylene group, cyclo-hexamethylene or 1-methyl-ethylene; an arylene group such as a phenylene, naphtalene or an heteroarylene group; an arylalkylene group such as benzyl group; an oxy-alkylene group such as methylene oxide, ethylene oxide or propylene oxide group; an oxy-arylene or oxy-heteroarylene group such as phenylene oxide; —O—; —S—; —C(=O)—; —C(=S)—; —SO$_2$—; —SO$_2$—NR$^a$—; —NR$^a$R$^b$—; —N=N—; or a combination of two or more of these groups, wherein R$^a$ and R$^b$ independently are hydrogen or an optionally substituted alkyl, alkenyl, alkynyl, aralkyl, alkaryl, aryl or heteroaryl group. The linking group may be divalent when two triazaindolisine compounds are linked, trivalent when three triazaindolisine compounds are linked, or tetravalent when four triazaindolisine compounds are linked. A divalent linking group is preferred. Trazaindolisine-11 is an example of such a triazaindolisine compound.

During developing of an image-wise exposed heat-sensitive lithographic printing plate precursor, the sludge inhibiting agent is present in the aqueous alkaline developing solution.

In accordance with a preferred embodiment of the present invention, the sludge inhibiting agent is present in the alkaline developing solution at the start of the developing process.

In accordance with another preferred embodiment of the present invention, the sludge inhibiting agent is added to the alkaline developing solution during the developing process, preferably as a solution or dispersion. In a more preferred embodiment, the sludge inhibiting agent is added to the alkaline developing solution by the addition of a replenishing solution comprising the sludge inhibiting agent during the developing process.

In accordance with another preferred embodiment of the present invention, the sludge inhibiting agent is added to the alkaline developing solution during the developing process by removing at least part of the coating of the precursor comprising the sludge inhibiting agent. The sludge inhibiting agent can be present in the heat-sensitive coating, a top layer and/or a layer on the back side of the plate.

Developing Solution

The aqueous alkaline developing solution (hereinafter also referred to as "developer") may comprise an alkaline agent. The composition of said aqueous alkaline solution can be selected from conventional alkaline developers.

The aqueous alkaline developing solution of the present invention has preferably a pH value of at least 10, more preferably is of at least 11.5, most preferably of at least 12. There is no specific upper limit for the pH but the pH is usually not higher than 14.

The alkaline agent includes inorganic alkaline agents such as sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium bicarbonate, potassium bicarbonate, ammonium bicarbonate, sodium borate, potassium borate and ammonium borate, and potassium citrate, sodium citrate and the like.

The alkaline agent may also include organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylenediamine, pyridine and the like.

The alkaline aqueous solution may also include an alkaline silicate. The alkaline silicate may be those exhibiting an alkalinity when dissolved in water, and examples thereof include an alkali metal silicate and alkali metal metasilicate such as sodium silicate, sodium metasilicate, potassium silicate and lithium silicate, and ammonium silicate. Said alkaline silicate may be used alone, or in combination.

The development performance of the alkaline aqueous solution may be easily modulated by adjusting a molar ratio of alkaline silicates and alkali metal hydroxides, represented by silicon oxide (SiO$_2$) and an alkali oxide (M$_2$O, wherein M represents an alkali metal or an ammonium group). The alkaline aqueous solution has preferably a molar ratio SiO$_2$/M$_2$O from 0.5 to 3.0, and more preferably from 1.0 to 2.0. When the molar ratio SiO$_2$/M$_2$O is less than 0.5, alkalinity of the solution strengthens so as to cause a harmful effect such as etching of an aluminum plate which is generally used as a substrate in a lithographic printing plate precursor. When the molar ratio, SiO$_2$/M$_2$O is more than 3.0, the development performance of the solution may be degraded.

The concentration of alkaline silicate in the developer ranges generally from 1 to 14% by weight, preferably from 3 to 14% by weight, and more preferably from 4 to 14% by weight. When said concentration is less than 1% by weight, the development performance or treatment capacity may be degraded. When said concentration is more than 14% by weight, precipitated materials or crystals may be easily generated, and gelation may be easily caused during neutralization of waste liquid, resulting in an obstacle to the waste disposal.

The developer based on an alkaline aqueous solution may also comprise a nonreducing sugar. The nonreducing sugar denotes sugars having no reductive property due to the absence of a free aldehyde group or a free ketone group. Said nonreducing sugar is classified into trehalose-type oligosaccharides wherein a reductive group and another reductive group make a linkage; glycosides wherein a reductive group in a sugar is linked to a non-sugar compound; and sugar alcohols which are produced by reducing a sugar with hydrogenation. Said trehalose-type oligosaccharides include sucrose and trehalose, and said glycosides include alkyl glycosides, phenol glycosides, mustard oil glycosides and the like. Said sugar alcohols include D,L-arabitol, ribitol, xylitol, D,L-sorbitol, D,L-mannitol, D,L-iditol, talitol, dulcitol, allodulcitol and the like. Further, maltitol obtained by hydrogenation of disaccharide, a reduced material obtained by hydrogenation of oligosaccharide (a reduced starch syrup) and the like are preferably used. In the above nonreducing sugar, preferred are sugar alcohols and sucrose, and particularly preferred are D-sorbitol, sucrose and a reduced starch syrup, since they have buffering action in the appropriate pH range.

The above nonreducing sugar may be used alone or in combination with other ingredients, and the concentration thereof in the developer ranges generally from 0.1 to 30% by weight, and preferably from 1 to 20% by weight.

In the developer, an alkaline agent may be used as a base in combination with the above mentioned alkaline silicate or nonreducing sugar, and said alkaline agent may be selected from sodium hydroxide and potassium hydroxide. Further, sodium tertiary phosphate, potassium tertiary phosphate, sodium carbonate and potassium carbonate are also preferable, since they have themselves, buffering action. The above alkaline agent may be used alone or in combination.

The developer may optionally contain further components, such as buffer substances, complexing agents, antifoaming agents, organic solvents, corrosion inhibitors, dyes, surfactants and/or hydrotropic agents as known in the art.

In the aqueous alkaline developing solution, it is possible to simultaneously use organic solvents having solubility in water at 20° C. of not more than 15% by weight according to need. Examples of such organic solvents are such carboxilic acid esters as ethyl acetate, propyl acetate, butyl acetate, amyl acetate, benzyl acetate, ethylene glycol monobutyl ether acetate, butyl lactate and butyl levulinate; such ketones as ethyl butyl ketone, methyl isobutyl ketone and cyclohexanone; such alcohols as ethylene glycol monobutyl ether, ethylene glycol benzyl ether, ethylene glycol monophenyl ether, benzyl alcohol, methylphenylcarbinol, n-amyl alcohol and methylamyl alcohol; such alkyl-substituted aromatic hydrocarbons as xylene; and such halogenated hydrocarbons as methylene dichloride and monochlorobenzene. These organic solvents may be used alone or in combination. Particularly preferred is benzyl alcohol in the invention. These organic solvents are added to the developer or replenisher therefor generally in an amount of not more than 10% by weight and preferably not more than 5% by weight.

Besides the components described above, the developing solution of the present invention comprises a non-ionic surfactant. Such a non-ionic surfactant may be used as a dissolution preventing agent whereby undercutting of non-exposed areas is reduced. Examples of nonionic surfactants include ethoxylated alcohols, polyethylene glycols and polyhydric alcohols. Ethoxylated alcohols are preferred, and in particular ethoxylated alcohols having a hydrophilic-lipophilic balance (HLB) higher than 5 are more preferred. Specific examples of nonionic surfactants are listed below: polyethylene glycol, polyoxyethylene glycol, lauryl ether, laurylalcohol polyglycol ethers, oleyl alcohol ethoxylated, lanolin alcohol ethoxylated, dodecanol ethoxylated, cetostearyl alcohol ethoxylated, tetramethyldecindiol ethoxylated, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene block copolymers, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, polyoxyethylene sorbitan monolaurate, and sorbitan monolaurate. These non-ionic surfactants preferably have an average molecular weight ranging from 500 to 10,000, preferably from 1000 to 5000. They can be comprised individually or as admixture of two or more compounds in an amount ranging from 0.05 to 5%, preferably from 0.1 to 1% by weight of the total developing solution.

The developers used in the present invention may simultaneously contain another surfactant for the purpose of improving developing properties thereof. By incorporating surfactants to the developer solution, the surface tension reduces drastically and the developer solution becomes effective—i.e. removal of the non-image areas without occurrence of stain/toning—at a lower pH compared to the same developer solution without a surfactant. The developer may comprise an ionic surfactant such as anionic or cationic surfactant, a non-ionic surfactant and/or amphoteric surfactants such as Librateric AA30 (trademark from Libra Chemicals Limited). Examples is of such surfactants include salts of higher alcohol (C8~C22) sulfuric acid esters such as sodium salt of lauryl alcohol sulfate, sodium salt of octyl alcohol sulfate, ammonium salt of lauryl alcohol sulfate, Teepol B-81 (trade mark, available from Shell Chemicals Co., Ltd.) and sodium alkyl sulfates; salts of aliphatic alcohol phosphoric acid esters such as sodium salt of cetyl alcohol phosphate; alkyl aryl sulfonic acid salts such as sodium salt of dodecylbenzene sulfonate, sodium salt of isopropylnaphthalene sulfonate, sodium salt of dinaphthalene disulfonate and sodium salt of metanitrobenzene sulfonate; sulfonic acid salts of alkylamides such as $C_{17}H_{33}CON(CH_3)CH_2CH_2SO_3Na$ and sulfonic acid salts of dibasic aliphatic acid esters such as sodium dioctyl sulfosuccinate and sodium dihexyl sulfosuccinate. These surfactants may be used alone or in combination. Particularly preferred are sulfonic acid salts. These surfactants may be used in an amount of generally not more than 5% by weight and preferably not more than 3% by weight.

The cationic surfactant used in the developer may include amine salts, quaternary ammonium salts, phosphonium salts, sulfonium salts and the like. Examples of the amine salts are primary amine salts, secondary amine salts, tertiary amine salts, and imidazoline salts. Examples of the quaternary ammonium salts include tetraalkyl quaternary ammonium salts, trialkyl benzyl quaternary ammonium salts, alkyl pyridinium salts, alkyl quinolinium salts, imidazolinium salts and benzimidazolinium salts.

Exemplary amphoteric surfactants include betaine derivatives, such as, for example, alkylamidopropyl betaine, alkyldimethyl betaine, bishydroxyethyl betaine, alkylamido propyl betaine, lauryl betaine, and the like, glycine derivatives, such as, for example, cocoamphocarboxy glycinate, lauroamphocarboxy glycinate, caprylamphocarboxy glycinate, oleoamphocarboxy glycinate, oleoamphopolycarboxy glycinate, N-alkyl glycinate, and the like, imino derivatives, such as, for example, cocoiminodipropionate, octyliminodipropionate, and the like, imidazoline derivatives, such as, for example, coconut imidazoline, and the like, lecithin derivatives, and aminocarboxylic acids. These amphoteric surfactants preferably have an average molecular weight ranging from 500 to 10,000, preferably from 1,000 to 5,000. They can be comprised individually or as admixture of two or more compounds.

The above described anionic and amphoteric surfactant can be present in the developing solution of the present invention in a total amount ranging from 0.5 to 10%, preferably from 1 to 6%, and more preferably from 1 to 3% by weight of the total developing solution.

In order to enhance developing stability of the developers, the following compounds may simultaneously be used. Examples of such compounds are neutral salts such as NaCl, KCl and KBr as disclosed in JN-A-58-75 152; chelating agents such as EDTA and NTA as disclosed in JN-A-58-190 952 (U.S. Pat. No. 4,469,776), complexes such as [Co (NH$_3$)$_6$]Cl$_3$ as disclosed in JN-A-59-121 336 (U.S. Pat. No. 4,606,995); ionizable compounds of elements of the group IIa, IIIa or IIIb of the Periodic Table such as those disclosed in JN-A-55-25 100; anionic or amphoteric surfactants such as sodium alkyl naphthalene sulfonate and N-tetradecyl-N,N-dihydroxyethyl betaine as disclosed in JN-A-50-51 324; tetramethyldecyne diol as disclosed in U.S. Pat. No. 4,374,920; non-ionic surfactants as disclosed in JN-A-60-213 943; cationic polymers such as methyl chloride quaternary products of p-dimethylaminomethyl polystyrene as disclosed in JN-A-55-95 946; amphoteric polyelectrolytes such as copolymer of vinylbenzyl trimethylammonium chloride and sodium acrylate as disclosed in JN-A-56-142 528; reducing inorganic salts such as sodium sulfite as disclosed in JN-A-57-192 952 (U.S. Pat. No. 4,467,027) and alkaline-soluble mercapto compounds or thioether compounds such as thiosalicylic acid, cysteine and thioglycolic acid; inorganic lithium compounds such as lithium chloride as disclosed in JN-A-58-59 444; organic lithium compounds such as lithium benzoate as disclosed in JN-A-50 34 442; organometallic surfactants containing Si, Ti or the like as to disclosed in JN-A-59-75 255; organoboron compounds as disclosed in JN-A-59-84 241 (U.S. Pat. No. 4,500,625); quaternary ammonium salts such as tetraalkylammonium oxides as disclosed in EP-A-101 010; and bactericides such as sodium dehydroacetate as disclosed in JN-A-63-226 657.

Replenishing Solution

During the development the non-image areas of the coating are removed with an aqueous alkaline developer solution optionally in combination combined with mechanical rubbing, e.g. by a rotating brush. During the development step, any water-soluble layer present is preferably also removed. The development is preferably carried out at temperatures of from 20 to 40° C. in automated processing units as customary in the art.

To perform development processing stably for a long time period, it is particularly important to control the strength of alkali and the concentration of silicates and other ingredients in the developer. Therefor, a replenishing solution, hereinafter also referred to as replenisher, is added to the developing solution, usually in small amounts such that a stable development processing can be performed over a long time period without exchanging the developer. Therefor, it is also important that the concentration of the sludge inhibiting agent of the present invention is present in the developing solution at a sufficiently high level in order to prevent sludge formation and this can be realised by adding a replenisher comprising the sludge inhibiting agent of the present invention.

For regeneration, the replenishing solution preferably comprises active ingredients of the developing solution such as alkaline agent. The replenishing solution is added continuously or in small amounts to the developing solution during or after the developing process in order to regulate the concentration of the active ingredients in the developing solution at a level sufficiently high or at a constant level such that the development of image-wise exposed precursors remains at a constant level. The required amounts of regenerated material must be tailored to the developing apparatuses used, daily plate throughputs, image areas, etc. and are in general from 1 to 150 ml per square meter of plate precursor. The addition of replenisher can be regulated, for is example, by measuring the conductivity of the developer as described in EP-A 0,556, 690.

In the method for development processing, any known means of supplementing a replenisher for developer may also be employed. Examples of such methods preferably used are a method for intermittently or continuously supplementing a replenisher as a function of the amount of plates processed and time as disclosed in JN-A-55-115 039 (GB-A-2 046 931), a method comprising disposing a sensor for detecting the degree of light-sensitive layer dissolved out in the middle portion of a developing zone and supplementing the replenisher in proportion to the detected degree of the light-sensitive layer dissolved out as disclosed in JN-A-58-95 349 (U.S. Pat. No. 4,537,496); a method comprising determining the impedance value of a developer and processing the detected impedance value by a computer to perform supplementation of a replenisher as disclosed in GB-A-2 208 249.

In a preferred embodiment of the present invention, the sludge inhibiting agent is present in a replenishing solution at a concentration of at least 0.5 g/l, preferably in a concentration ranging between 1 and 50 g/l, more preferably between 2 and 30 g/l, more preferably between 3 and 20 g/l, most preferably between 3 and 15 g/l. In another preferred embodiment, the ratio of the concentration of the sludge inhibiting agent in the replenishing solution, containing at least 0.5 g/l of the sludge inhibiting agent, and in the developing solution is preferably between 0.5 and 100, more preferably between 1.1 and 100, most preferably between 2 and 50.

The replenishing solution has preferably a pH value of at least 10, more preferably of at least 11.5, most preferably of at least 12. There is no specific upper limit for the pH but the pH is usually not higher than 14.

In another embodiment of the present invention, more than one replenishing solutions can be used for adding to the developing solution during or after the development processing and these replenishers may contain different types in different amounts of sludge inhibiting agents of the present invention, and also is different types in different amounts of other compounds for improving the development processing.

In a more preferred embodiment of the present invention, the fresh developing solution at starting the development processing for the first time is essentially free of the sludge inhibiting agent of the present invention and during or after processing precursors, a replenishing solution, containing a sludge inhibiting agent of the present invention, is added to the developing solution and/or a layer of the precursor, comprising a sludge inhibiting agent of the present invention, is removed at least partially in the developing solution.

The heat-sensitive lithographic printing plate precursor of the present invention comprises a support having a hydrophilic surface or which is provided with a hydrophilic layer, and, on said support, a heat-sensitive coating.

Support

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. A preferred support is a metal support such as aluminum or stainless steel. The metal can also be laminated to a plastic layer, e.g. polyester film.

A particularly preferred lithographic support is an electrochemically grained and anodized aluminum support. Graining and anodization of aluminum is well known in the art. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A 1 084 070, DE-A 4 423 140, DE-A 4 417 907, EP-A 659 909, EP-A 537 633, DE-A 4 001 466, EP-A 292 801, EP-A 291 760 and U.S. Pat. No. 4,458,005.

Coating

The heat-sensitive coating, which is provided on the support, may be positive-working or negative-working. A positive-working heat-sensitive coating is preferred. The coating of a positive-working heat-sensitive coating does not dissolve in an alkaline developing solution in the unexposed areas and becomes soluble in the exposed areas within the time used for developing the plate. The coating preferably comprises an infrared absorbing agent and an alkaline soluble oleophilic resin whereof the solubility in an alkaline developing solution is reduced in the coating and whereof the solubility in an alkaline developing solution is increased upon heating or IR-radiation. The coating preferably further comprises a dissolution inhibitor whereby rate of dissolution in an alkaline developing solution is reduced. Due to this solubility differential the rate of dissolution of the exposed areas is sufficiently higher than in the non-exposed areas.

In a preferred embodiment of the present invention, the heat-sensitive coating comprises a first polymer which is a phenolic resin such as novolac, resol or a polyvinylphenolic resin; novolac is more preferred. Typical examples of such polymers are described in DE-A-4007428, DE-A-4027301 and DE-A-4445820. Other preferred polymers are phenolic resins wherein the phenyl group or the hydroxy group of the phenolic monomeric unit are chemically modified with an organic substituent as described in EP 894 622, EP 901 902, EP 933 682, WO99/63407, EP 934 822, EP 1 072 432, U.S. Pat. No. 5,641,608, EP 982 123, WO99/01795, WO04/035310, WO04/035686, WO04/035645, WO04/035687 or EP 1 506 858.

The novolac resin or resol resin may be prepared by polycondensation of at least one member selected from aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-etylphenol, propylphenol, n-butylphenol, t-butylphenol, 1-naphtol and 2-naphtol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used.

The weight average molecular weight, measured by gel permeation chromatography using universal calibration and polystyrene standards, of the novolac resin is preferably from 500 to 150,000 g/mol, more preferably from 1,500 to 50,000 g/mol.

The poly(vinylphenol) resin may also be a polymer of one or more hydroxy-phenyl containing monomers such as hydroxystyrenes or hydroxy-phenyl (meth)acrylates. Examples of such hydroxystyrenes are o-hydroxystyrene, m-hydroxystyrene, p-hydroxystyrene, 2-(o-hydroxyphenyl) propylene, 2-(m-hydroxyphenyl)propylene and 2-(p-hydroxyphenyl)propylene. Such a hydroxystyrene may have a substituent such as chlorine, bromine, iodine, fluorine or a $C_{1-4}$ alkyl group, on its aromatic ring. An example of such hydroxy-phenyl (meth)acrylate is 2-hydroxy-phenyl methacrylate.

The poly(vinylphenol) resin may usually be prepared by is polymerizing one or more hydroxy-phenyl containing monomer in the presence of a radical initiator or a cationic polymerization initiator. The poly(vinylphenol) resin may also be prepared by copolymerizing one or more of these hydroxyphenyl containing monomers with other monomeric compounds such as acrylate monomers, methacrylate monomers, acrylamide monomers, methacrylamide monomers, vinyl monomers, aromatic vinyl monomers or diene monomers.

The weight average molecular weight, measured by gel permeation chromatography using universal calibration and polystyrene standards, of the poly(vinylphenol) resin is preferably from 1.000 to 200,000 g/mol, more preferably from 1,500 to 50,000 g/mol.

Examples of phenolic resins are:

POL-01: ALNOVOL™ SPN452 is a solution of a novolac resin, 40% by weight in Dowanol™ PM, obtained from CLARIANT GmbH.

Dowanol™ PM consists of 1-methoxy-2-propanol (>99.5%) and 2-methoxy-1-propanol (<0.5%).

POL-02: ALNOVOL™ SPN400 is a solution of a novolac resin, 44% by weight in Dowanol™ PMA, obtained from CLARIANT GmbH.

Dowanol™ PMA consists of 2-methoxy-1-methyl-ethylactetate.

POL-03: ALNOVOL™ HPN100 a novolac resin obtained from CLARIANT GmbH.

POL-04: DURITE™ PD443 is a novolac resin obtained from BORDEN CHEM. INC.

POL-05: DURITE™ SD423A is a novolac resin obtained from BORDEN CHEM. INC.

POL-06: DURITE™ SD126A is a novolac resin obtained from BORDEN CHEM. INC.

POL-07: BAKELITE™ 6866LB02 is a novolac resin obtained from BAKELITE AG.

POL-08: BAKELITE™ 6866LB03 is a novolac resin obtained from BAKELITE AG.

POL-09: KR 400/8 is a novolac resin obtained from KOYO CHEMICALS INC.

POL-10: HRJ 1085 is a novolac resin obtained from SCHNECTADY INTERNATIONAL INC.

POL-11: HRJ 2606 is a phenol novolac resin obtained from SCHNECTADY INTERNATIONAL INC.

POL-12: LYNCUR™ CMM is a copolymer of 4-hydroxystyrene and methyl methacrylate obtained from SIBER HEGNER.

In another preferred embodiment of the present invention, the heat-sensitive coating further comprises a second polymer which is insoluble in water and soluble in an alkaline solution.

In accordance with a more preferred embodiment of the present invention, the heat-sensitive coating comprises a heat-sensitive layer and an intermediate layer. The intermediate layer is present between the heat-sensitive layer and the hydrophilic surface of the support. In a still more preferred embodiment, the heat-sensitive layer comprises a first polymer and optionally an inhibitor, and the intermediate layer comprises a second polymer.

The second polymer is preferably an organic polymer which has acidic groups with a pKa of less than 13 to ensure that the layer is soluble or at least swellable in aqueous alkaline developers.

Advantageously, the binder is a polymer, formed by polyaddition or by polycondensation, for example a polyester, a polyamide resin, an epoxy resin, an acetal resin, an acrylic resin, a methacrylic resin, a styrene based resin, a polyurethane resin or polyurea.

The second polymer has more preferably one or more functional groups selected from the list of (i) a sulfonamide group such as —$SO_2$—NH—$R^g$ wherein $R^g$ represents a hydrogen or an optionally substituted hydrocarbon group such as an optionally substituted alkyl, aryl or heteroaryl group, (ii) an active imide group such as —$SO_2$—NH—CO—$R^h$, —$SO_2$—NH—$SO_2$—$R^h$ or —CO—NH—$SO_2$—$R^h$ wherein $R^h$ represents a hydrogen or an optionally substituted hydrocarbon group such as an optionally substituted alkyl, aryl or heteroaryl group, (iii) a carboxyl group, (iv) a sulfonic group, and (v) a phosphoric group; a sulfonamide group or an active imide group are more preferred; most preferred are polymers selected from a copolymer comprising a N-benzylmaleimide monomeric unit or a monomeric unit comprising a sulfonamide group as described in EP-A 933 682, EP 0 894 622 (page 3 line 16 to page 6 line 30), EP-A 0 982 123 (page 3 line 56 to page 51 line 5), EP-A 1 072 432 (page 4 line 21 to page 10 line 29) and WO 99/63407 (page 4 line 13 to page 9 line 37).

Other polymers having an acidic group are polycondensates and polymers having free phenolic hydroxyl groups, as obtained, for example, by reacting phenol, resorcinol, a cresol, a xylenol or a trimethylphenol with aldehydes, especially formaldehyde, or ketones. Condensates of sulfamoyl- or carbamoyl-substituted aromatics and aldehydes or ketones are also suitable. Polymers of bismethylol-substituted ureas, vinyl ethers, vinyl alcohols, vinyl acetals or vinylamides and polymers of phenylacrylates and copolymers of hydroxyphenylmaleimides are likewise suitable. Furthermore, polymers having units of vinylaromatics, N-aryl(meth)acrylamides or aryl (meth)acrylates may be mentioned, it being possible for each of these units also to have one or more carboxyl groups, phenolic hydroxyl groups, sulfamoyl groups or carbamoyl groups. Specific examples include polymers having units of 2-hydroxyphenyl (meth)acrylate, of N-(4-hydroxyphenyl)(meth)acrylamide, of N-(4-sulfamoylphenyl)-(meth)acrylamide, of N-(4-hydroxy-3,5-dimethylbenzyl)-(meth)acrylamide, or 4-hydroxystyrene or of hydroxyphenylmaleimide. The polymers may additionally contain units of other monomers which have no acidic units. Such units include vinylaromatics, methyl (meth)acrylate, phenyl(meth)acrylate, benzyl (meth)acrylate, methacrylamide or acrylonitrile.

Dissolution Inhibitor

In a preferred embodiment of the present invention, the heat-sensitive coating or the heat-sensitive layer also contain one or more dissolution inhibitors. Dissolution inhibitors are compounds which reduce the dissolution rate of the hydrophobic polymer in the aqueous alkaline developer at the non-exposed areas of the coating and wherein this reduction of the dissolution rate is destroyed by the heat generated during the exposure so that the coating readily dissolves in the developer at exposed areas. The dissolution inhibitor exhibits a substantial latitude in dissolution rate between the exposed and non-exposed areas. By preference, the dissolution inhibitor has a good dissolution rate latitude when the exposed coating areas have dissolved completely in the developer before the non-exposed areas are attacked by the developer to such an extent that the ink-accepting capability of the coating is affected. The dissolution inhibitor(s) can be added to the layer which comprises the hydrophobic polymer discussed above.

The dissolution rate of the non-exposed coating in the developer is preferably reduced by interaction between the hydrophobic polymer and the inhibitor, due to e.g. hydrogen bonding between these compounds. Suitable dissolution inhibitors are preferably organic compounds which comprise at least one aromatic group and a hydrogen bonding site, e.g. a carbonyl group, a sulfonyl group, or a nitrogen atom which may be quaternized and which may be part of a heterocyclic ring or which may be part of an amino substituent of said organic compound. Suitable dissolution inhibitors of this type have been disclosed in e.g. EP-A 825 927 and 823 327.

Water-repellent polymers represent another type of suitable dissolution inhibitors. Such polymers seem to increase the developer resistance of the coating by repelling the aqueous developer from the coating. The water-repellent polymers can be added to the layer comprising the first polymer and/or can be present in a separate layer provided on top of the layer with the first polymer. In the latter embodiment, the water-repellent polymer forms a barrier layer which shields the coating from the developer and the solubility of the barrier layer in the developer or the penetrability of the barrier layer by the developer can be increased by exposure to heat or infrared light, as described in e.g. EP-A 864420, EP-A 950 517 and WO99/21725. Preferred examples of the water-repellent polymers are polymers comprising siloxane and/or perfluoroalkyl units. In one embodiment, the coating contains such a water-repellent polymer in an amount between 0.5 and 25 mg/m$^2$, preferably between 0.5 and 15 mg/m$^2$ and most preferably between 0.5 and 10 mg/m$^2$. When the water-repellent polymer is also ink-repelling, e.g. in the case of polysiloxanes, higher amounts than 25 mg/m$^2$ can result in poor ink-acceptance of the non-exposed areas. An amount lower than 0.5 mg/m$^2$ on the other hand may lead to an unsatisfactory development resistance. The polysiloxane may be a linear, cyclic or complex cross-linked polymer or copolymer. The term polysiloxane compound shall include any compound which contains more than one siloxane group —Si(R, R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another embodiment, the water-repellent polymer is a block-copolymer or a graft-copolymer of a poly(alkylene oxide) block and a block of a polymer comprising siloxane and/or perfluoroalkyl units. A suitable copolymer comprises about 15 to 25 siloxane units and 50 to 70 alkylene oxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Such a copolymer acts as a surfactant which upon coating, due to its bifunctional structure, automatically positions itself at the interface between the coating and air and thereby forms a separate top layer even when the whole coating is applied from a single coating solution. Simultaneously, such surfactants act as a spreading agent which improves the coating quality. Alternatively, the water-repellent polymer can be applied in a second solution, coated on top of the layer comprising the hydrophobic polymer. In that embodiment, it may be advantageous to use a solvent in the second coating solution that is not capable of dissolving the ingredients present in the first layer so that a highly concentrated water-repellent phase is obtained at the top of the coating.

Development Accelerator

Preferably, also one or more development accelerators are included in the heat-sensitive coating or in the heat-sensitive layer, i.e. compounds which act as dissolution promoters because they are capable of increasing the dissolution rate of the non-exposed coating in the developer. The simultaneous application of dissolution inhibitors and accelerators allows a precise fine tuning of the dissolution behavior of the coating. Suitable dissolution accelerators are cyclic acid anhydrides, phenols or organic acids. Examples of the cyclic acid anhydride include phthalic anhydride, tetrahydrophthalic anhydride, hexahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3", 4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole.

Sludge Inhibiting Agent

In accordance with a preferred embodiment of the present invention, the sludge inhibiting agent is added to the developing solution by removing at least part of the precursor wherein said sludge inhibiting agent of the present invention is present. In this embodiment, the layer comprising the sludge inhibiting agent is removed at least partially during development, preferably, the sludge inhibiting agent is present in the heat-sensitive coating or in the heat-sensitive layer and/or the intermediate layer and/or in a top layer and/or in an optional other layer on the back side of the support.

According to a more preferred embodiment, the sludge inhibiting agent is present in the heat-sensitive coating or in the heat-sensitive layer and/or the intermediate layer whereby the layer comprising the sludge inhibiting agent is removed at the exposed areas in the developing solution. In this way, it is highly advantageous that the amount of sludge inhibiting agent added to the developing solution is in correspondence with the amount of dissolved ingredients, causing and/or inducing the formation of sludge. When the precursor has a toplayer which is removed only on the exposed areas, the sludge inhibiting agent can also be present in the toplayer and the addition of sludge inhibiting agent is also in correspondence with the exposed areas. In this way the sludge inhibiting agent is released in proportion with exposed areas and the amount of sludge inhibiting agent present in such an image-wise dissolving coating ranges preferably between 0.01 $g/m^2$ to 2.5 $g/m^2$, more preferably between 0.05 $g/m^2$ to 1.5 $g/m^2$, most preferably between 0.07 $g/m^2$ to 1.0 $g/m^2$.

According to another preferred embodiment of the present invention, the sludge inhibiting agent is present in a layer on the back side of the support and this layer is removed at least partially in the developing solution. In this way the addition of sludge inhibiting agent is proportional with the surface of the precursors which are developed. In an analoguous way, the sludge inhibiting agent can also be present in a top layer which is removed also in the non-exposed areas. In this way the sludge inhibiting agent is released in proportion with surface of the precursor and the amount of sludge inhibiting agent present in such a layer ranges preferably between 0.01 $g/m^2$ to 2.0 $g/m^2$, more preferably between 0.05 $g/m^2$ to 1.5 $g/m^2$, most preferably between 0.07 $g/m^2$ to 1.0 $g/m^2$.

According to another embodiment of the present invention, the sludge inhibiting agent, present in the heat-sensitive coating or in the heat-sensitive layer, may have an additional benefit of an improved sensitivity at the image-wise exposure of the precursor. The concentration of the sludge inhibiting agent for obtaining an improved sensitivity may be different from the concentration for obtaining the optimum sludge inhibiting activity, usually an improved sensitivity may be obtained at a lower concentration of the sludge inhibiting agent, preferably between 0.01 and 0.20 $g/m^2$. In order to obtain an optimum sludge inhibiting activity, it is advantageous to combine a precursor, having this lower concentration of the sludge inhibiting agent, with a developing solution (or replenisher), having the sludge inhibiting agent.

Exposure

The material can be image-wise exposed directly with heat, e.g. by means of a thermal head, or indirectly by infrared light, which is preferably converted into heat by an infrared light absorbing compound, which may be a dye or pigment having an absorption maximum in the infrared wavelength range. The infrared light absorbing dye or pigment is preferably present in the heat-sensitive coating or the heat-sensitive layer and typically in a concentration ranging between 0.25 and 10.0 wt. %, more preferably between 0.5 and 7.5 wt. % relative to the coating as a whole. Preferred IR-absorbing compounds are dyes such as cyanine or merocyanine dyes or pigments such as carbon black. A suitable compound is the following infrared dye IR-1:

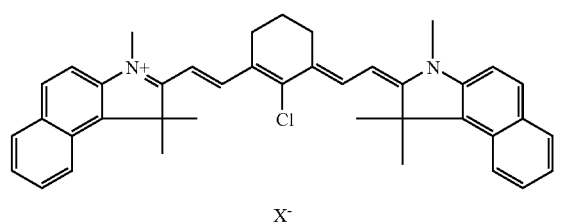

(IR-1)

X⁻ wherein X⁻ is a suitable counter ion such as tosylate.

The heat-sensitive coating, or the heat-sensitive layer and/or the intermediate layer, may further contain an organic dye which absorbs visible light so that a perceptible image is obtained upon image-wise exposure and subsequent development. Such a dye is often called contrast dye or indicator dye. Preferably, the dye has a blue color and an absorption maximum in the wavelength range between 600 nm and 750 nm. Although the dye absorbs visible light, it preferably does not sensitize the printing plate precursor, i.e. the coating does not become more soluble in the developer upon exposure to visible light. Suitable examples of such a contrast dye are the quaternized triarylmethane dyes.

According to a preferred embodiment, the contrast dye is present in the heat-sensitive coating, or the heat-sensitive layer and/or the intermediate layer.

According to a highly preferred embodiment, the infrared light absorbing compound is concentrated in the heat-sensitive coating or the heat-sensitive layer.

The printing plate precursor of the present invention can be exposed to infrared light with LEDs or a laser. Preferably, a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at 1/e² of maximum intensity: 10-25 μm), the scan speed and the resolution of the exposure apparatus (i.e. the number of addressable pixels per unit of linear distance, often expressed in dots per inch or dpi; typical value: 1000-4000 dpi, corresponding to about 39.4-157.5 dots per mm).

Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. Nos. 5,174,205 and 5,163,368.

The development step may be followed by a rinsing step and/or a gumming step. The gumming step involves post-treatment of the lithographic printing plate with a gum solution. A gum solution is typically an aqueous liquid which comprises one or more surface protective compounds that are capable of protecting the lithographic image of a printing plate against contamination or damaging. Suitable examples of such compounds are film-forming hydrophilic polymers or surfactants.

The plate precursor can, if required, be post-treated with a suitable correcting agent or preservative as known in the art. To increase the resistance of the finished printing plate and hence to extend the run length, the layer can be briefly heated to elevated temperatures ("baking"). The plate can be dried before baking or is dried during the baking process itself. During the baking step, the plate can be heated at a temperature which is higher than the glass transition temperature of the heat-sensitive coating, e.g. between 100° C. and 230° C. for a period of 40 seconds to 5 minutes. Baking can be done in conventional hot air ovens or by irradiation with lamps emitting in the infrared or ultraviolet spectrum. As a result of this baking step, the resistance of the printing plate to plate cleaners, correction agents and UV-curable printing inks increases. Such a thermal post-treatment is described, inter alia, in DE 1,447,963 and GB 1,154,749.

The printing plate thus obtained can be used for conventional, so-called wet offset printing, in which ink and an aqueous dampening liquid is supplied to the plate. Another suitable printing method uses so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

Preparation of Binder-01.

In a 250 ml reactor, 162 mmol of Monomer-01, 21.3 g (132 mmol) benzyl acrylamide, 0.43 g (6 mmol) acrylic acid and 103 g gamma-butyrolactone were added and the mixture was heated to 140° C., while stirring at 200 rpm. A constant flow of nitrogen was put over the reactor. After dissolution of all the components, the reactor was cooled to 100° C. 0.35 ml Trigonox™ DC50, commercially available from AKZO NOBEL, was added followed by the addition of 1.39 ml Trigonox™ 141, commercially available from AKZO NOBEL, in 3.43 ml butyrolactone. The polymerization was started and the reactor was heated to 140° C. over 2 hours while dosing 1.75 ml Trigonox™ D050. The mixture was stirred at 400 rpm and the polymerization was allowed to continue for 2 hours at 140° C. The reaction mixture was cooled to 120° C. and the stirrer speed was enhanced to 500 rpm. 85.7 ml 1-methoxy-2-propanol was added and the reaction mixture was allowed to cool down to room temperature.

Binder-01 was analyzed with ¹H-NMR-spectroscopy and size exclusion chromatography, using dimethyl acetamide/0.21% LiCl as eluent on a 3× mixed-B column and relative to polystyrene standards.

| | $M_n$ | $M_w$ | PD |
|---|---|---|---|
| Binder-01 | 23500 | 67000 | 2.84 |

The reaction mixture was cooled to 40° C. and the resulting 25 weight polymer solution was collected in a drum.

Monomer-01:

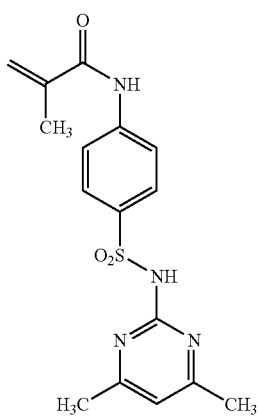

Preparation of the Lithographic Support.

A 0.30 mm thick aluminum foil was degreased by immersing the foil in an aqueous solution containing 34 g/l of sodium hydroxide at 70° C. for 6 seconds and rinsed with demineralized water for 3.6 seconds. The foil was then electrochemically grained during 8 seconds using an alternating current in an aqueous solution containing 15 g/l HCl, 15 g/l $SO_4^2$ ions and 5 g/l $Al^{3+}$ at a is temperature of 37° C. and a current density of 100 A/dm², The aluminum foil was then desmutted by etching with an aqueous solution containing 145 g/l of sulfuric acid at 80° C. for 5 seconds and rinsed with demineralized water for 4 seconds. The foil was subsequently subjected to anodic oxidation during 10 seconds in an aqueous solution containing 145 g/l of sulfuric acid at a temperature of 57° C. and a current density of 25 A/dm², then washed with demineralized water for 7 seconds and post-treated for 4 seconds with a solution containing 2.2 g/l of polyvinylphosphonic acid at 70° C., rinsed with demineralized water for 3.5 seconds and dried at 120° C. for 7 seconds.

The support thus obtained was characterized by a surface roughness Ra of 0.35-0.40% μm (measured with interferometer NT1100) and an anodic weight of 3.0 g/m².

Preparation of the Printing Plate Precursor PPP-01

The PPP-01 was produced by first applying a first coating layer defined in Table 1 onto the above described lithographic support. The coating was applied at a wet coating thickness of 20 μm and then dried at 135° C. The total dry coating weight amounts to 0.75 g/m².

TABLE 1

Composition of the solution of the first coating layer

| INGREDIENTS | Amount of product (g) |
| --- | --- |
| Dowanol ™ PM (1) | 253.26 |
| THF (2) | 575.0 |
| Binder-01 (25% by weight) (3) | 165.46 |
| Crystal Violet (4) | 0.63 |
| Tegoglide ™ 410 (1% by weight) (5) | 5.64 |

(1) Dowanol ™ PM is 1-methoxy-2-propanol, commercially available from DOW CHEMICAL Company.
(2) THF is tetrahydrofuran.
(3) Binder-01, preparation see above.
(4) Crystal Violet, commercially available from CIBA-GEIGY.
(5) TEGOGLIDE ™ 410 is a copolymer of polysiloxane and poly(alkylene oxide), commercially available from TEGO CHEMIE SERVICE GmbH.

On the first coated layer, a second layer as defined in Table 2 was coated at a wet coating thickness of 25 μm and dried at 135° C. The dry coating weight amounts to 0.67 g/m².

Table 2: Composition of the solution of the second coating layer.

| INGREDIENTS | Amount of product (g) |
| --- | --- |
| Dowanol ™ PM (1) | 427.0 |
| Butanone | 484.0 |
| Alnovol ™ SPN452 (40% by weight) (2) | 58.68 |
| TMCA (10% by weight) (3) | 2.23 |
| SOO94 (4) | 1.0 |
| Crystal Violet (5) | 0.39 |
| Fluorad ™ FC4432 (1% by weight) (6) | 22.27 |
| Tegoglide ™ 410 (1% by weight) (7) | 4.45 |

(1) See Table 1.
(2) Alnovol ™ SPN452 is a novolac solution, 40.5% by weight in Dowanol ™ PM, commercially available from CLARIANT.
(3) TMCA is 3,4,5-trimethoxy cinnamic acid.
(4) SOO94 is an IR absorbing cyanine dye, commercially available from FEW CHEMICALS; the chemical structure of SOO94 is equal to IR-1 with $X^-$ is tosylate anion.
(5) See Table 1.
(6) FLUORAD ™ FC4432 is a solution of a fluor-copolymer 1% by weight in Dowanol PM, commercially available from 3M.
(7) See Table 1.

Imaging and Processing of the Printing Plate Precursor PPP-01.

A number of printing plate precursors PPP-01, having a total area of 1000 cm², were exposed with a Creo Trendsetter 3244 (plate-setter, trademark from Creo, Burnaby, Canada), operating at 150 rpm and at an energy density of 200 mJ/cm².

After exposure the plates were cut into 24 strips of 4.5 cm×9.5 cm, and all these strips were consecutively processed by dipping the strips into 20 ml of a developer, as defined in Table 4 and 5 and in Table 6 and 7, at a temperature of 25° C. and during 30 seconds and the resulting solution adsorbed on each strip is squeezed off.

After processing of the strips, 15 ml of the developing solution remains and this solution was kept at 25° C. during 4 days. The solution was centrifuged by a Heraeus Labofuge 400 at 3500 rpm, and the amount of sludge was determined gravimetrically by evaporation of the residue during 4 hours at 130° C.

TABLE 4

Composition of the developing solutions DEV-01 to DEV-12

| INGREDIENTS | DEV-Reference-01 (g) | DEV-01 to DEV-12 (g) |
| --- | --- | --- |
| Na-metasilicate (1) | 100 | 100 |
| Crafol ™ AP261 (2) | 10.80 | 10.80 |
| Surfynol ™ 104H (3) | 0.67 | 0.67 |
| Synperonic ™ T304 (4) | 4.32 | 4.32 |
| Na-Benzoate (5) | 2.00 | 2.00 |
| Water until a triazaindolisine compound added as defined in Table 5 | 1000 | 1000 amount of added triazaindolisine compound as defined in Table 5 |

(1) Na-metasilicate is sodium metasilicate pentahydrate, commercially available from SILMACO NV
(2) Crafol ™ AP261 is alkylether sodium salt, commercially available from COGNIS
(3) Surfynol ™ 104H is a surfactant, commercially available from KEYSER&MACKAY
(4) Synperonic ™ T304 is a block-co-polymer of polyethylene oxide (=PEO) and polypropylene oxide (=PPO) attached to ethylenediamine (=EDA) in a ratio EDA/PEO/PPO of 1/15/14 and having a mean molecular weight of 1600, commercially available from UNIQEMA
(5) Na-Benzoate is benzoic acid sodium salt.

Table 5 summarizes the amount of sludge for each type of developing solution DEV-01 to DEV-12 and for DEV-Reference-01.

TABLE 5

Results of sludge evaluation

| EXAMPLE | Precursor | Developer | Type of triazaindolisine compound | Amount triazaindolisine compound (g) | Amount of sludge in 15 ml developer (mg) |
|---|---|---|---|---|---|
| Comparative Example 1 | PPP-01 | DEV-Ref-01 | — | — | 149 |
| Invention Example 1 | PPP-01 | DEV-01 | Triazaindolisine-01 | 15 | 60 |
| Invention Example 2 | PPP-01 | DEV-02 | Triazaindolisine-01 | 20 | 56 |
| Invention Example 3 | PPP-01 | DEV-03 | Triazaindolisine-02 | 5 | 71 |
| Invention Example 4 | PPP-01 | DEV-04 | Triazaindolisine-02 | 15 | 56 |
| Invention Example 5 | PPP-01 | DEV-05 | Triazaindolisine-03 | 5 | 64 |
| Invention Example 6 | PPP-01 | DEV-06 | Triazaindolisine-04 | 15 | 86 |
| Invention Example 7 | PPP-01 | DEV-07 | Triazaindolisine-05 | 5 | 89 |
| Invention Example 8 | PPP-01 | DEV-08 | Triazaindolisine-06 | 5 | 60 |
| Invention Example 9 | PPP-01 | DEV-09 | Triazaindolisine-06 | 15 | 52 |
| Invention Example 10 | PPP-01 | DEV-10 | Triazaindolisine-07 | 5 | 87 |
| Invention Example 11 | PPP-01 | DEV-11 | Triazaindolisine-07 | 15 | 76 |
| Invention Example 12 | PPP-01 | DEV-12 | Triazaindolisine-08 | 5 | 84 |

The results in Table 5 demonstrate that for the Invention Examples 1 to 12, comprising different types of trazaindolisine compounds of the present invention in different concentrations in the developing solution, the formation of sludge is reduced in comparison with the Comparative Example 1, comprising no sludge inhibiting agent.

The invention claimed is:

1. A method for making a positive-working lithographic printing plate comprising the steps of:
   (1) providing a heat-sensitive positive-working lithographic printing plate precursor comprising, on a support having a hydrophilic surface or which is provided with a hydrophilic layer, a heat-sensitive coating comprising (i) an infrared absorbing agent, (ii) an alkaline soluble oleophilic resin wherein the solubility in an alkaline developing solution is reduced in the coating and wherein the solubility in an alkaline developing solution is increased upon heating or IR-radiation,
   (2) image-wise exposing said precursor with IR-radiation or heat, and
   (3) developing said image-wise exposed precursor with an alkaline developing solution comprising a sludge inhibiting agent, wherein a sludge inhibiting agent is not present in said precursor, and wherein said sludge inhibiting agent is a triazaindolisine compound having a structure according to formula I,

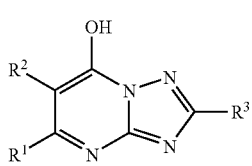

(I)

wherein
   $R^1$ is hydrogen, an optionally substituted alkyl, alkenyl, alkynyl, aralkyl, alkaryl, aryl or heteroaryl group, $-OR^4$, $-COOR^5$, $-CO-NR^6R^7$, $-NR^8-CO-R^{12}$ or $-NR^{10}R^{11}$;
   $R^2$ is hydrogen, an optionally substituted alkyl, alkenyl, alkynyl, aralkyl, alkaryl, aryl or heteroaryl group, a halogen, $-COOR^5$, $-CO-NR^6R^7$, $-NR^8-CO-R^{12}$ or $-NR^{10}R^{11}$;
   $R^3$ is hydrogen, an optionally substituted alkyl, alkenyl, alkynyl, aralkyl, alkaryl, aryl or heteroaryl group, $-SR^9$, $-COOR^5$, $-CO-NR^6R^7$, $-NR^8-CO-R^{12}$ or $-NR^{10}R^{11}$;
   $R^4$ to $R^{11}$ independently are selected from hydrogen, an optionally substituted alkyl, alkenyl, alkynyl, aralkyl, alkaryl, aryl or heteroaryl group;
   $R^{12}$ is selected from hydrogen, an optionally substituted alkyl, alkenyl, alkynyl, aralkyl, alkaryl, aryl or heteroaryl group, $-OR^{13}$ or $-NR^{10}R^{11}$;
   $R^{13}$ is selected from an optionally substituted alkyl, alkenyl, alkynyl, aralkyl, alkaryl, aryl or heteroaryl group; or
   each of $R^1$ and $R^2$, $R^6$ and $R^7$, $R^8$ and $R^{12}$, or $R^{10}$ and $R^{11}$ represent the necessary atoms to form a 5 to 7 membered ring.

2. The method according to claim 1, wherein $R^1$ and $R^2$ independently are selected from hydrogen or an optionally substituted alkyl group.

3. The method according to claim 1, wherein $R^3$ is selected from hydrogen, an optionally substituted alkyl group having 1 to 5 carbon atoms, or $-SR^9$.

4. The method according to claim 1, wherein $R^3$ is hydrogen.

5. The method according to claim 1, wherein during or after said developing step, a replenishing solution comprising said sludge inhibiting agent is added to said developing solution.

6. The method according to claim 1, wherein said alkaline developing solution comprising said sludge inhibiting agent further comprises a silicate or metasilicate.

7. The method according to claim 2, wherein $R^3$ is selected from hydrogen, an optionally substituted alkyl group having 1 to 5 carbon atoms, or —$SR^9$.

8. The method according to claim 2. wherein $R^3$ is hydrogen.

9. The method according to claim 2, wherein during or after said developing step, a replenishing solution comprising said sludge inhibiting agent is added to said developing solution.

10. The method according to claim 2, wherein said alkaline developing solution comprising said sludge inhibiting agent further comprises a silicate or metasilicate.

\* \* \* \* \*